(12) United States Patent
Neely et al.

(10) Patent No.: US 10,084,310 B1
(45) Date of Patent: Sep. 25, 2018

(54) LOW-INDUCTANCE DIRECT CURRENT POWER BUS

(71) Applicant: Sandia Corporation, Albuquerque, NM (US)

(72) Inventors: Jason C. Neely, Albuquerque, NM (US); Joshua Stewart, Albuquerque, NM (US); Jarod James Delhotal, Albuquerque, NM (US); Jack David Flicker, Albuquerque, NM (US); Geoff L. Brennecka, Morrison, CO (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 45 days.

(21) Appl. No.: 15/426,844

(22) Filed: Feb. 7, 2017

Related U.S. Application Data (60) Provisional application No. 62/292,473, filed on Feb. 8, 2016.

(51) Int. Cl.
| | |
|---|---|
| *H01L 23/34* | (2006.01) |
| *H02J 1/02* | (2006.01) |
| *H01L 29/16* | (2006.01) |
| *H02M 7/00* | (2006.01) |
| *B60L 11/18* | (2006.01) |
| *B60R 16/03* | (2006.01) |

(52) U.S. Cl.
CPC .............. *H02J 1/02* (2013.01); *B60L 11/1803* (2013.01); *H01L 29/1608* (2013.01); *H02M 7/003* (2013.01); *B60R 16/03* (2013.01); *Y10S 903/00* (2013.01)

(58) Field of Classification Search
USPC ....................................................... 174/70 B
See application file for complete search history.

(56) References Cited

U.S. PATENT DOCUMENTS

| | | | | |
|---|---|---|---|---|
| 4,126,822 A | * | 11/1978 | Wahlstrom | ............. G04C 10/00 |
| | | | | 310/309 |
| 4,349,862 A | * | 9/1982 | Bajorek | ................. H01L 23/15 |
| | | | | 174/258 |

(Continued)

OTHER PUBLICATIONS

Henze, N. et al., "Reliability considerations of low-power grid-tied inverter for photovoltaic application", 24th European Photovoltaic Solar Energy Conference and Exhibition, Germany, Sep. 2009, pp. 21-25.

(Continued)

*Primary Examiner* — Timothy Thompson
*Assistant Examiner* — Krystal Robinson
(74) *Attorney, Agent, or Firm* — Martin I. Finston (57) ABSTRACT

A DC power bus having reduced parasitic inductance and higher tolerable operating temperature is disclosed. In example embodiments, a bus structure overlies a printed circuit board, and an array of capacitors is arranged on a surface of the printed circuit board distal the bus structure. The bus structure comprises an upper metal plate, a lower metal plate, and a dielectric film interposed between the upper and lower metal plates. The capacitors are connected in parallel between conductive planes of the printed circuit board. The upper and lower metal plates of the bus structure are connected to respective conductive planes of the printed circuit board.

15 Claims, 5 Drawing Sheets

(56) References Cited

U.S. PATENT DOCUMENTS

| | | | | | |
|---|---|---|---|---|---|
| 4,499,524 | A | * | 2/1985 | Shioleno | H01G 2/06 361/772 |
| 4,562,315 | A | * | 12/1985 | Aufderheide | H03K 17/9622 200/5 A |
| 5,590,016 | A | * | 12/1996 | Fujishiro | H01G 4/35 174/264 |
| 5,973,928 | A | * | 10/1999 | Blasi | H01L 23/50 174/250 |
| 6,359,331 | B1 | * | 3/2002 | Rinehart | H01L 23/642 257/691 |
| 6,924,562 | B2 | * | 8/2005 | Kinoshita | H01L 23/49838 257/698 |
| 8,345,074 | B2 | * | 1/2013 | Okazaki | G06K 15/1247 347/111 |
| 9,425,701 | B2 | * | 8/2016 | Koyano | H02M 5/293 |
| 9,444,359 | B2 | * | 9/2016 | Mori | H02M 7/003 |
| 2002/0088977 | A1 | * | 7/2002 | Mori | H01L 23/49822 257/68 |
| 2003/0133257 | A1 | * | 7/2003 | Beihoff | B60L 11/12 361/600 |
| 2004/0027841 | A1 | * | 2/2004 | Jakob | H02M 7/003 363/59 |
| 2004/0228094 | A1 | * | 11/2004 | Ahmed | H01L 25/072 361/702 |
| 2005/0262966 | A1 | * | 12/2005 | Chandler | B01J 2/006 75/331 |
| 2006/0108684 | A1 | * | 5/2006 | Stevanovic | H01L 24/49 257/728 |
| 2006/0152085 | A1 | * | 7/2006 | Flett | B60L 9/30 307/75 |
| 2006/0164189 | A1 | * | 7/2006 | Tohya | H01L 23/50 333/238 |
| 2008/0253158 | A1 | * | 10/2008 | Mochikawa | H02M 1/34 363/133 |
| 2010/0089641 | A1 | * | 4/2010 | Esmaili | H05K 7/1432 174/70 B |
| 2010/0207455 | A1 | * | 8/2010 | Erickson, Jr. | G05F 1/67 307/82 |
| 2010/0328883 | A1 | * | 12/2010 | Ledezma | H02M 7/003 361/690 |
| 2012/0081934 | A1 | * | 4/2012 | Garrity | H02M 7/4807 363/37 |
| 2012/0139483 | A1 | * | 6/2012 | Cottet | H01G 2/06 320/107 |
| 2014/0269034 | A1 | * | 9/2014 | Manipatruni | G11C 11/1697 365/158 |
| 2014/0375294 | A1 | * | 12/2014 | Lv | H02H 9/025 323/299 |
| 2015/0243413 | A1 | * | 8/2015 | Stoltzfus | H01C 1/028 338/231 |
| 2017/0018366 | A1 | * | 1/2017 | Gustafson | H01G 4/30 |

OTHER PUBLICATIONS

Rabuffi, M. et al., "Status Quo and Future Prospects for Metallized Polypropylene Energy Storage Capacitors", IEEE Transactions on Plasma Science, 2002, vol. 30. pp. 1939-1942.

Cree, "Design Considerations for Designing with Cree SiC Modules: Part 2. Techniques for Minimizing Parasitic Inductance", Cree Technical Report, 2013, CREE-CPWRAN13.

Olszewski, M. "Evaluation of the 2010 Toyota Prius Hybrid Synergy Drive System", Oakridge National Laboratory, 2011, Tech Report ORNL/TM-2010/25.

Component Technical Committee, Automotive Electronics Council, Stress test qualifications for passive componenets, Spefications, AEC-Q200 Rev D, 2010.

IPC—Association Connecting Electronics Industries, "Generic standard on printed board design", Specification, IPC-221B, 2012.

KEMET, Electronics Corporation, "Facedown Low-Inductance Solder Pad and Via Schemes", Aug. 2008.

KEMET Electronics Corporation, "Flex Crack Mitigation Ceramic Surface Mount Solutions" Rev. 3, 2014.

KEMET Electronics Corporation, High Voltage with Flexible Termination System (HV FT-CAP) X7R Deilectric, 500-3,000 VDC (Automotive Grade), Greenville, SC, Datasheet, C1025_X7R_HV-FT-CAP_SMD, 2015.

Rashkin, L. et al., "Miniature High Voltage, High Temperature Component package Development", International Power Modulator and High Voltage Conference, Jul. 2016, San Francisco, CA.

Flicker J. et al., "Module-level Paralleling of Vertical GaN PhN Diodes", Workshop on Wide Bandgap Power Devices and Applications (WiPDA), 2016, Fayetteville, AR.

Yi, R. et al., "Modeling of Busbars in High Power Neutral Point Clamped Three-Level Inverters", Tsinghua Science and Technology, 2008, vol. 13, pp. 91-97.

Schanen, J. et al., "Modeling of low inductive Busbar Connections", IEEE Industry Applications Magazine, 1996, pp. 39-43.

Li, Y. et al., "Current Mode Control for Boost Converters with Constant Power Loads", IEEE Transactions and Circuits and Systems I: Regular Papers, 2012, vol. 59, pp. 198-206.

Zaitsu, R., Voltage Mode Boost Converter Small Signal Control Loop Analysis Usint the TPS61030, Texas Instruments Application Report SLVA274A, 2009.

Flack, E. et al., "Modeling of Parasitic Inductive Effects in Power Modules", Power Semiconductor Devices and IC's, IEEE International Symposium, 1997.

* cited by examiner

| Parameter | Value |
|---|---|
| $r_{bb}$ | 25 mΩ |
| $L_{bb}$ | 30 nH |
| $C_{bb}$ | 4 nF |
| $r_c$ | 0.36 mΩ |
| $L_c$ | 3.0 pH |
| $C$ | 50.4 μF |

| Bus Design | $f$ (kHz) | Temp (°C) | $V_{bias}$ (V) | $\Delta V/V_0$ (%) | $I_{CLRMS}$ (A) | $I_{Cbot,RMS}$ (A) |
|---|---|---|---|---|---|---|
| Prius | 5 | NA | 250 | 4.2 | 4.1 | 12.7 |
|  | 10 |  |  | 3.5 | 3.5 | 10.4 |
|  | 5 |  | 450 | 6.2 | 13.0 | 38.9 |
|  | 10 |  |  | 4.9 | 12.1 | 36.2 |
|  | 5 |  | 650 | 7.5 | 22.9 | 68.7 |
|  | 10 |  |  | 4.4 | 22.9 | 68.6 |
| Proposed | 100 | 27 | 250 | 1.0 | 0.036 | 12.0 |
|  |  |  | 450 | 3.1 | 0.107 | 35.8 |
|  |  |  | 650 | 5.4 | 0.183 | 61.5 |
|  |  | 75 | 250 | 1.0 | 0.036 | 11.9 |
|  |  |  | 450 | 3.2 | 0.106 | 35.77 |
|  |  |  | 650 | 5.5 | 0.183 | 61.5 |
|  |  | 125 | 250 | 1.0 | 0.036 | 12.0 |
|  |  |  | 450 | 3.2 | 0.106 | 35.7 |
|  |  |  | 650 | 5.3 | 0.184 | 61.7 |

FIG. 8

LOW-INDUCTANCE DIRECT CURRENT POWER BUS

CROSS-REFERENCE TO RELATED APPLICATION

This application claims priority to U.S. Provisional Patent Application No. 62/292,473, filed on Feb. 8, 2016 under the title, "LOW-INDUCTANCE DIRECT CURRENT POWER BUS," the entirety of which is hereby incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The invention relates to electric power systems, and more particularly to systems that deliver DC power to or from power inverters. More particularly, the invention relates to power systems for electric vehicles, hybrid electric vehicles, solar photovoltaic power converters, and the like.

Art Background

The drive systems for electric vehicles (EVs) and hybrid electric vehicles (HEVs) must include circuitry to interconvert between the DC output current and charging current of batteries and the AC current produced by generators and used to drive motors. Moreover, power converters for electric power systems such as photovoltaic electric power converters (PVEPCs) must convert the DC current from photovoltaic (PV) cells to AC current. Similar circuitry must also shift between various DC voltage levels. The devices that perform these tasks, commonly referred to as power inverters and DC-to-DC converters, operate in part by the rapid switching of electric currents.

The power transistors that perform the switching function are subject to severe demands for power-handling ability and reliability. Advanced silicon devices such as silicon insulated gate bipolar transistors (IGBTs) are influential in this field because they are one of the factors enabling the widespread adoption of commercial EVs, HEVs, and PVEPCs. However, silicon as a switching material has inherent limitations that make further improvements in device performance increasingly difficult.

New improvements are now being realized through the application of wide bandgap materials such as silicon-carbide (SiC) and gallium nitride (GaN). Relative to silicon, these more exotic materials permit faster switching frequencies, higher operating voltages, and higher junction temperatures. These capabilities can lead to new converters with improved efficiency and higher power density. Indeed, the next big development will likely be based on high-current SiC switches with a target switching frequency at or above 100 kHz.

The DC bus in a power system (also referred to here as a DC "link") is responsible for delivering DC power between producers and consumers of energy in the system. It also assures that the power is delivered without excessive ripple. It does this by using parallel capacitors to provide a low shunt impedance to the high-frequency current components in order to smooth out current spikes created by the switching operations in the power inverters and converters.

The designs for typical DC power buses in use at the present time are optimized for silicon IGBTs with switching frequencies closer to 10 kHz than to 100 kHz.

Power systems are susceptible to ripple, i.e. to unwanted periodic components in the power supply output due to incomplete power conversion from alternating to direct current. Contemporary DC links typically have large capacitors and large parasitic inductances. When inductances are large, operation at switching speeds greater than 10 kHz tends to place the ripple frequency in the "inductive region" of the bus impedance, which can actually increase the ripple voltage. Furthermore, bus inductance can cause transients that damage transistors when they switch off; this typically motivates the use of bulky snubbing capacitors at or near the transistor module. Furthermore, the film capacitors used in contemporary systems have relatively poor heat conduction, and they are generally not reliable at temperatures substantially greater than 100° C.

Link parasitic inductance has been recognized as a problem. One approach to the design of capacitor banks that reduce link parasitic inductance is described in the publication, "Design Considerations for Designing with Cree SiC Modules: Part 2. Techniques for Minimizing Parasitic Inductance", Cree Technical Report, 2013, CREE-CPWRAN13.

As device operating temperatures and switching frequencies increase, the DC bus as well as the passive filter components and features for thermal management will need to be redesigned so that they are optimized for higher-frequency switching devices such as SiC power transistors and GaN transistors.

Accordingly, there is an interest in the field of electric power systems for new DC bus designs that effectively utilize high-frequency switching devices.

SUMMARY OF THE INVENTION

We have developed such a new DC bus design. The parasitic inductance in our new design is reduced substantially relative to typical DC link realizations in DC-AC converter systems in EVs, HEVs, and PVEPCs that are currently on the market.

Broadly speaking, we use a printed circuit board (PCB) to combine many ceramic capacitors in parallel electrically and also to connect these capacitors to large metal conductors. The large metal conductors carry DC current and are intended to also be of a low inductance design. High frequency currents are filtered and smoothed by the ceramic capacitors on the PCB.

More specifically, the reduction in inductance is achieved, in part, by replacing electrolytic or large film capacitors with multilayer ceramic capacitors (MLCCs). The total number of MLCCs is relatively large; it may be one hundred or more in some embodiments. The inductance is also reduced by using a printed circuit board (PCB) to maximize the planar capacitance, and by carefully controlling the placement of capacitors on the PCB such that the magnetic flux around contiguous components cancels. The low-inductance design enables the component to filter high-frequency currents.

In addition, adding multiple connections between the large metal conductors and the PCB enhances the conduction of heat out of the PCB. Meanwhile, the MLCC components offer greater heat tolerance than more conventional components. Hence the combined use of a PCB and ceramic capacitors enables improved thermal management and higher-temperature operation. This allows the DC link capacitor to be reduced in size without reducing power, and conversely it allows the converter to process more power with the same or a smaller-size DC link capacitor.

Because of the reduced inductance and the greater heat tolerance of the MLCCs, the bus can operate at higher temperatures and higher frequency than conventional DC links for automotive, grid-tied, and similar systems. It can therefore be used advantageously in combination with SiC transistors, GaN transistors, and other wide-bandgap solid-state switching devices. This, in turn, opens up a wide field of potential new uses for such wide-bandgap devices. Furthermore, since the intended implementation places the MLCCs in close proximity to the transistor module, the need for separate snubbing capacitors may be obviated.

Accordingly, the invention in an embodiment is a DC power bus comprising a PCB or other insulative base member having substantially planar upper and lower surfaces and at least a first and a second electrically conductive metal layer laminated onto or within the insulative base member. The embodiment also comprises a bus structure that overlies the upper surface of the insulative base member and a plurality of capacitors mounted in a capacitor array on the lower surface of the insulative base member.

The bus structure comprises an upper metal bus plate, a lower metal bus plate, and a dielectric film interposed between the upper and lower metal bus plates. Each of the capacitors mounted in the capacitor array is electrically connected between the first and second laminated electrically conductive metal layers such that said capacitors are connected in parallel with each other. The upper and lower metal bus plates are respectively electrically connected to the first and second laminated electrically conductive metal layers of the base member.

DETAILED DESCRIPTION

Figure 1A:
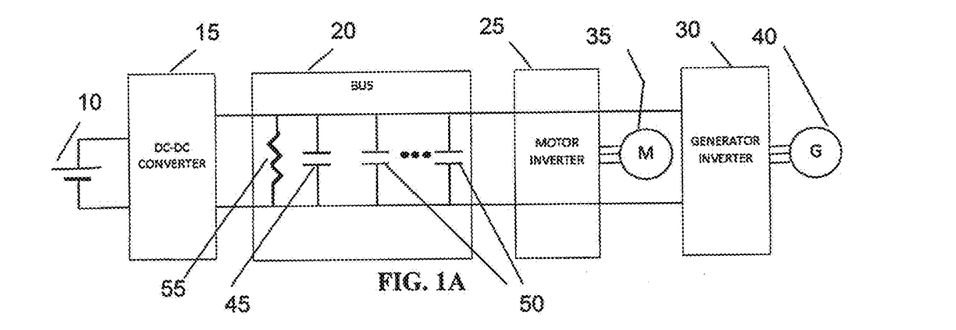
FIG. 1A is a notional block diagram of a representative automotive electrical power system.

FIG. 1A is a notional block diagram of a representative electrical power system for an automobile. Visible in the figure are battery 10 and DC-DC converter 15, which may, for example, boost the battery voltage from 200V to up to 650V. Also visible in the figure is high-voltage (HV) DC link bus 20, which connects the high-voltage side of the DC-DC converter to motor inverter 25 and generator inverter 30. The motor inverter drives motor 35, and the generator inverter permits electrical power from generator 40 to be utilized or fed back and stored in the battery.

Shown within HV bus block 20 is representative smoothing capacitor 45 and a bank of filter capacitors 50. Also shown is burden resistor 55.

Figure 1B:
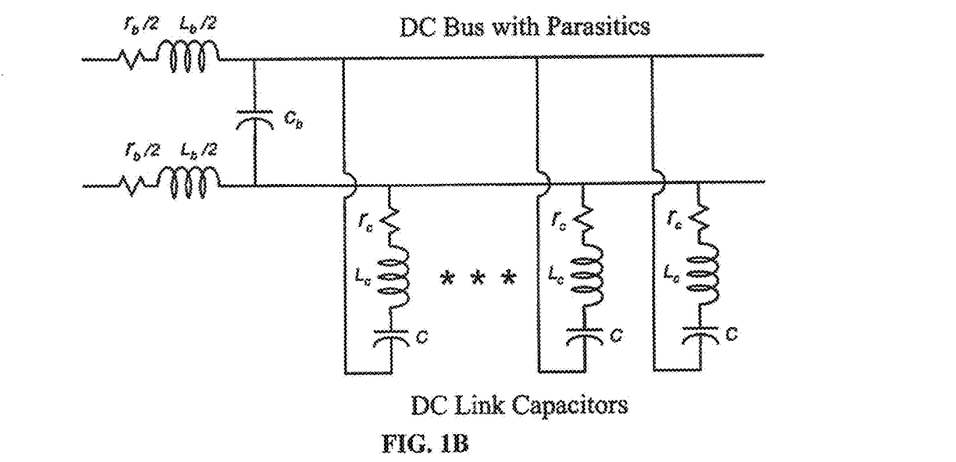
FIG. 1B is an electrical schematic diagram of the equivalent circuit for a typical DC link in a DC-AC inverter, such as one in a vehicular power system or grid-tied inverter. The circuit as shown includes elements representing the equivalent series inductance and the equivalent series resistance of DC link capacitors.

The DC link of an electric vehicle (EV), hybrid electric vehicle (HEV) drive system, or grid-tied system of some kinds such as photovoltaic electric power converters (PVE-PCs) typically includes bulky filter capacitors that have some parasitic loss and large parasitic inductance. FIG. 1B shows an equivalent circuit for a typical DC link circuit where the equivalent series inductance (ESL) and equivalent series resistance (ESR) of the bus and individual capacitors are represented. These parasitic elements limit the switching frequency of the power electronics. Furthermore, it is typical to use filter capacitors of a kind that is limited in its temperature of operation.

Manufacturers are interested in the development of new high power density, high specific power, power electronic drives for use in electric and hybrid electric vehicles and in grid-tied applications. These designs will almost certainly exploit new wide bandgap (WBG) semiconductor materials, such as silicon carbide (SiC), gallium nitride (GaN), and aluminum gallium nitride (AlGaN). Wide bandgap switching devices such as power transistors that are based on these and similar materials are capable of higher operating voltage, higher switching frequencies and higher junction temperatures than the silicon-based devices in current use.

To make the use of such devices more feasible, we have undertaken to develop a DC link design that reduces the ESR elements $r_c$ and the ESL elements $L_c$ and $L_b$ indicated in FIG. 1B.

Electrolytic capacitors have historically been used in power electronics because of their low cost and high energy density. However, there are concerns about the reliability of electrolytic capacitors for long-term operation. For example, electrolyte vaporization leads to increased ESR that can drastically affect circuit operation, causing poor current handling or even catastrophic failure. Due to these real or perceived drawbacks, there has been a trend among designers of power-conversion systems to replace electrolytic capacitors with film capacitors. Film capacitors have been improved enough in peak current and energy density to rival electrolytic capacitors, but at lower cost.

Typical dielectrics for film capacitors include polypropylene (PP), polyethylene terephthalate (PET), polyethylene naphthalate (PEN), and polyphenylene sulfide (PPS). Film dielectric is attractive because of its self-healing property which ensures a safe failure mode. Each dielectric material has tradeoffs in performance, cost, and temperature dependence. Most film capacitors utilize PP as the dielectric due to its low cost, low resistance, and highly consistent manufacturing.

Unfortunately, however, film and electrolytic capacitors are typically limited to temperatures below 105° C. For this reason among others, the quest to achieve switching rates above 100 kHz and high-temperature operation entails the consideration of new bus designs. This is especially so if it is an object to improve performance while also preserving economy and manufacturability.

Leaded film capacitors have been proposed as a candidate technology for minimizing parasitic inductance in DC links, and thus to support high-frequency switching. However, leaded film capacitors are also temperature limited. Moreover, the component geometry makes it unlikely that additional reductions in ESL can be achieved.

By contrast, we have chosen an approach that, in implementations, replaces the conventional DC link capacitors by printed circuit board (PCB) mounted multilayer ceramic capacitors (MLCCs). We have adopted further techniques that minimize the impedance and maximize heat dissipation.

Although a PCB was chosen as the base member for our prototype, it will be understood that any of various types of insulative bodies may alternatively serve as base members. Desirably, any such base member has two parallel, substantially planar principal faces which for convenience are here referred to as "upper" and "lower", or "top" and "bottom" faces without implying that any particular orientation is preferred when in use.

MLCCs are composed of layers of sintered ceramic power in alternation with interdigitated metal electrodes. These devices have high operating temperatures, excellent long-term reliability, high self-resonant frequencies (typically around 10 MHz) and high volumetric current densities.

MLCCs have been used extensively in lower-power electronics. However, due to the cost of precious metals used as the electrode (traditionally an 85/15 silver/palladium alloy), MLCCs have not been used as much in commercial high-power electronic circuits. As switching frequencies and operating temperatures of circuits increase due to the incorporation of WBG devices, however, MLCCs become more attractive. This is true not only because MLCCs are able to meet the temperature and frequency requirements, but also because the amount of filter capacitance that is needed decreases at higher frequencies.

Figure 2:
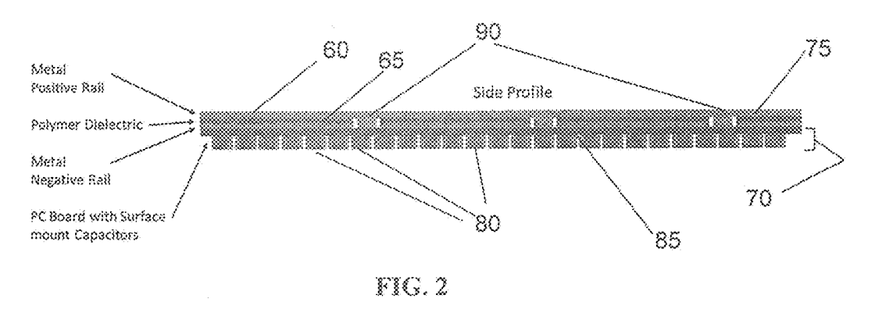
FIG. 2 is a partially schematic side-elevational view of our new DC link in an example embodiment.

Our new bus design is shown in a schematic side elevational view in FIG. 2. The bus includes two metal bus plates 60, 65 and a flat capacitor 70. The bus plates lie adjacent to and on either side of a polymer dielectric film 75. The flat capacitor is a multi-element capacitor made from a plurality of MLCCs 80 surface-mounted on the PCB 85 or other base member.

Although surface-mounting the MLCCs on only one side of the PCB will generally be preferable as offering the best thermal management, the possibility of mounting the MLCCs on both sides of the PCB is not excluded.

The bus plates, which have the form of metal sheets, replace the positive and negative rails that are used in conventional power buses. Conventional rails are typically separated by a large area that can be threaded by magnetic field lines, leading to high inductance due to the physically large current loop. By replacing the rails with plates that are separated only by the thickness of the intervening dielectric film, we are able to eliminate much of the inductance by decreasing the area of the current loop.

In our prototype, the PCB has two separated, horizontal copper layers, which are not shown in the figure. With reference to the top and bottom faces mentioned above, there is a top copper layer connected to the top bus plate, which carries, e.g., positive voltage, and there is a bottom copper layer connected to the bottom bus plate, which carries, e.g., the reference voltage.

The metal bus plates carry most of the DC current. Connections are provided at regular intervals from the metal bus plates to the respective conductive copper PCB layers to offer a low-impedance path for high frequency currents. FIG. 2 includes a schematic representation of connections 90 from the top bus plate to the corresponding PCB layer, but the figure does not contain enough detail to explicitly show connections from the bottom bus plate to its corresponding PCB layer.

A further advantage of the assembly of FIG. 2 is that its flat profile facilitates thermal management.

By connecting each of the bus plates intermittently to its corresponding copper PCB layer, we are able to reduce the total area threaded by magnetic flux and, in this way, to reduce the total inductance. In our prototype we used a regular linear array of connections, but a two-dimensional array is not excluded and may in fact be preferable. In examples illustrated below, multiple connections between a given plate and its corresponding PCB layer were arranged sequentially. However, it may be possible to further reduce parasitic inductance by staggering between top-layer connections and bottom-layer connections. In either event, the use of a multiplicity of spaced-out connections between each plate and its corresponding PCB layer is desirable for reducing inductance.

With further reference to FIG. 2, it will be seen that the top rail, which in the present example is the positive rail, is connected to the PCB through holes in the negative rail. The small inductances associated with these vertical interconnections add in parallel, so that in total, the inductance that they collectively contribute is very small. The capacitance contributed by the positive and negative plates is also of little significance, as it will typically amount to only a few picofarads. The more important design factor is the inductance, which is kept small, in part, by using a thin insulating film to separate the plates.

As a general rule, the bus bar inductance $L_{bb}$ should be as low as possible. To avoid operating within the "inductive region" at the switching frequency, it is desirable to have $L_{bb} < 1/((2\pi f_s)^2 C)$ where $f_s$ is the switching frequency and C is the DC link capacitance. Hence at a switching frequency of 100 kHz, it would be desirable to have $L_{bb} < 47$ nH.

The minimum DC link capacitance $C_{min}$ required to reduce the voltage ripple to a specified amplitude $\Delta V_{link}$ (or less) is inversely proportional to the switching frequency $f_s$, as expressed by the formula $$C_{min} = \frac{I_{max} D}{f_s \Delta V_{link}}. \tag{1}$$

where $I_{max}$ is the maximum current and D is the duty cycle.

Conversely, reducing the switching frequency allows inductors and capacitors more time to charge and discharge, thereby causing higher current and voltage ripples. One consequence of the relation expressed by Equation (1) is that an increase from a worst-case frequency of 5 kHz to a frequency of 100 kHz reduces the capacitance requirement by twenty-fold: According to our numerical simulations, it falls from 888 µF in a baseline device (see below) down to 44.4 µF.

Economical assembly is readily achieved using high-volume reflow soldering methods on solder-mask defined (SMD) technology. Of the available SMD capacitor options, film capacitors offer higher capacitances. Capacitors of this kind can be used in the present context. However, due to their low operating temperatures, they would need to be located in the "cooler regions" of the assembly, consequently reducing gains in system power density.

MLCCs, on the other hand, allow higher operating temperature. High-voltage MLCCs also offer higher energy density than SMD film capacitors in the 1000V range. Our prototype used a 0.15 µF, 1000V MLCC. These components have X7R dielectric and are AEC-Q200 qualified, thus making them suitable even for under-the-hood automotive applications.

One criterion for choosing an appropriate capacitance is that the capacitor must be able to handle the combined RMS ripple currents seen by the DC-DC converter, motor inverter, and generator inverter if these components are all present in the power system. Another criterion is that there must be enough capacitance to maintain the voltage ripple below a specified threshold. As pointed out above, the necessary capacitance generally decreases with increasing switching frequency. At a switching frequency of 5 kHz, a capacitance of 888 µF has been used effectively. Hence 5% of that amount, or 44.4 µF, would be expected to suffice for 100-kHz switching, which may be a target switching frequency for silicon carbide switching technologies.

Example

Prototype

Figure 3:
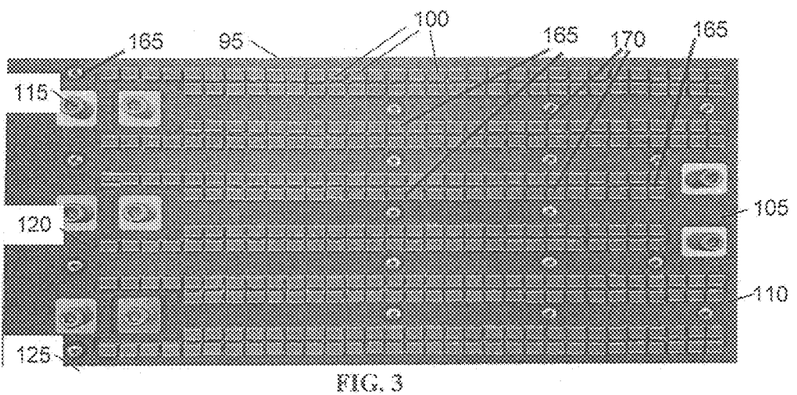
FIG. 3 provides a photographic image of a prototype DC link that was constructed according to the invention in an example embodiment. The image is a view of an assembled circuit board mounted to a pair of aluminum bus plates.

FIG. 3 is derived from a photographic image of the PCB used for our prototype. The PCB 95 was 6"×11" in lateral dimensions, and it had a thickness of 0.062". It had two conductive copper layers, with the required spacing between voltage potentials for avoidance of electrical breakdown. This was very important due to the high voltage and current levels present during operation.

An array of 336 MLCC capacitors 100 was connected in parallel to the PCB, providing a total nominal capacitance of 50.4 µF.

A multiple via-in-pad technique was used to connect the MLCCs to the PCB. This technique helped to minimize the loop inductance because it obviated the use of laterally extending conductors to make electrical connections.

The use of 2 oz. copper planes in the PCB facilitated heat dissipation and offered relatively low DC electrical resistance.

Figure 4:
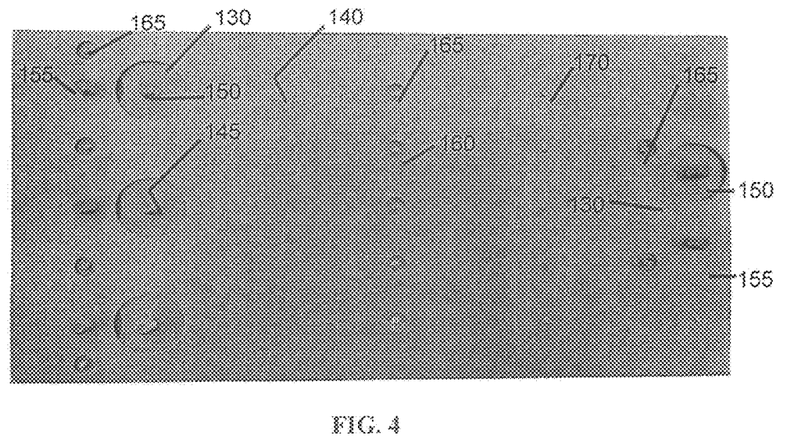
FIG. 4 is another photographic image of the prototype DC link. The image is a view of the aluminum bus plates. The bus plates are electrically isolated and arranged to carry DC current on one plate and return the current on the other plate.

The bus plates, which matched the profile of the circuit board, were made of aluminum. As noted above, they served as the primary conductors of DC current. FIG. 4 is based on a photographic image of the bus plates. If FIG. 3 is a front-side view, then FIG. 4 is a back-side view as would be obtained by flipping the assembly 180° about a horizontal centerline. The bus plates were separated by a 4-mil-thick polyester film. The film thickness is not critical. A typical thickness range is 4-5 mils, depending primarily on the maximum voltage stresses across the plates and the possibility of mechanical damage to the film during manufacture. It is desirable to use a film that has a long useful lifetime at a voltage differential greater than 600V, and that is durable against mechanical abrasion.

Referring back to FIG. 3, it will be seen that there are two contact pads 105, 110 on the right side of the PCB. In our prototype experiments, these pads connected to the DC source. The three pairs of pads 115, 120, 125 seen on the left side of the PCB were connected to a SiC MOSFET half-bridge assembly, which emulated a power inverter for purposes of our experiments.

Viewing FIGS. 3 and 4 together, it will be seen that for the contact pads, holes 130 in the bottom plate 140 facilitate connection of the top plate 145 through screws 150 to the top-side PCB layer, and screws 155 facilitate connection of the bottom plate to the bottom-side PCB layer. Similarly, for the high-frequency path, holes 160 in the bottom plate facilitate connection of the top plate through screws 165 to the top-side PCB layer, and screws 170 facilitate connection of the bottom plate to the bottom-side PCB layer.

Baseline Design

We selected the electrical power system of the 2010 Toyota® Prius as a basis for comparison. According to the available information, the Power Control Unit (PCU) of the 2010 Prius has a 27 kW bi-directional DC-DC converter for boosting the battery voltage to ranges between 201.6 V-650 V, and it operates at either 5 kHz or 10 kHz. The DC link bus is connected to the converter on one end and to a generator inverter and a motor inverter on the other end. This configuration allows a bi-directional power transfer between the battery and any combination of the internal combustion engine, generator inverter, and motor inverter.

The inverter DC bus has a total of 888 µF of DC link capacitance, realized using three parallel 296 µF film capacitors for smoothing. There is also a 53.8 kΩ burden resistor, and three additional film type filter capacitors. We obtained component values and dimensional information for the baseline power system from online data sheets and from M. Olszewski, "Evaluation of the 2010 Toyota® Prius Hybrid Synergy Drive System," *Tech report ORNL/TM*-2010/253, Oak Ridge National Laboratory, Oak Ridge, Tenn., March 2011.

We numerically modeled and simulated the baseline DC-DC converter to determine an expected range for ripple current and voltage transients. A lumped element model was used for the bus bars to account for parasitic inductance, resistance, and capacitance. As specifications were not available for the actual capacitors used in the Prius, a variety of film capacitors with similar ratings and dimensions were used to obtain an average value.

Figure 7:
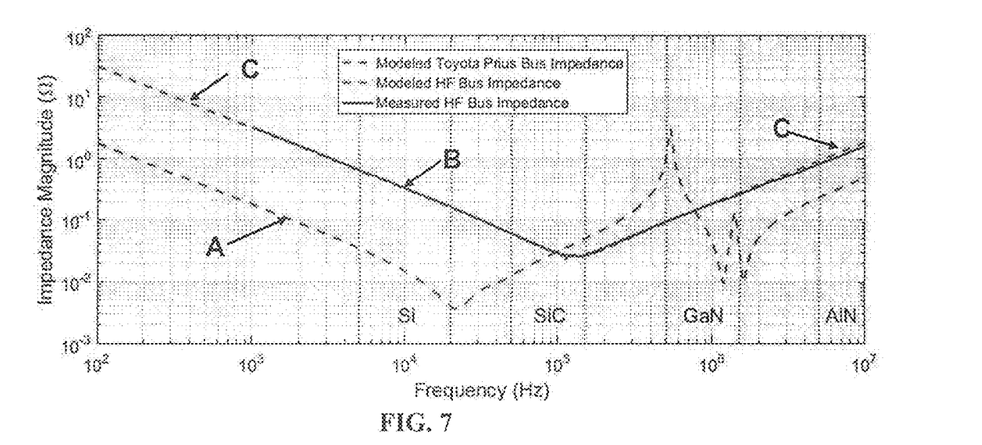
FIG. 7 is a magnitude Bode plot of impedance over a frequency range from 100 Hz to 10 MHz for three DC bus examples. Theoretical curves, generated by numerical simulation, are provided, respectively, for a baseline design and for our new DC bus in an idealized design. The third curve is based on measurements performed on a prototype of the new design that we built and tested.

Curve A of FIG. 7 shows the modeled and measured impedances on the baseline DC bus from the half-bridge interconnect pads, based on our simulations of the Prius system.

Impedance Measurement

The impedance of the prototype was measured using an Agilent 4294A impedance analyzer. An 801-point sweep was done from 100 Hz to 10 MHz. Curve B of FIG. 7 shows this measurement in comparison to the estimated frequency response for the 2010 Toyota® Prius model (curve A of the figure) and to a modeled frequency response of the prototype (curve C), which is discussed below. The minimum in each of the three curves in the figure corresponds to a resonant frequency.

Typical ranges for switching frequencies for different existing and projected semiconductor technologies (i.e., Si, SiC, GaN, and AlN) are also indicated for reference in FIG. 7.

The system impedance defines the relationship between the high-frequency currents through the half-bridge and the high-frequency voltage ripple applied to the half-bridge. For higher impedances, a given current will result in more ripple and thus more voltage stress on the device.

As those skilled in the art will appreciate, the system impedance is dominated by capacitance at frequencies below the resonance and by inductance at frequencies above the resonance. Minimizing the parasitic inductance consequently has the effect of shifting the resonance toward higher frequencies, or in other words, extending the capacitance-dominated regime upward in frequency. This is desirable because it makes higher-frequency operation feasible.

For operation with high-frequency switching devices such as silicon carbide (SiC) MOSFETs that switch at, e.g., 100 kHz, it would be advantageous to have a DC bus resonant frequency greater than 100 kHz to prevent excessive voltage ripple.

As seen in the figure, the new design as realized in our prototype shifted the resonant frequency from around 20 kHz (estimated) to around 125 kHz measured. The impedance is measured to be 29 mΩ at 100 kHz for the new design, which is lower than the 33 mΩ impedance estimated for the 2010 Toyota® Prius at 5 kHz. Above 100 kHz, the proposed design has substantially lower impedance than that estimated for the conventional design, thus enabling integration of SiC switches. Furthermore, the prototype is markedly smaller than the 888 g assembly, thus enabling greater power density.

It is noted that the measured resonant frequency of our prototype was lower than the expected value near 340 kHz. Various factors may contribute to this discrepancy. One possible factor arises because our estimates for the new design parasitics did not account for mutual inductances between the numerous current paths in the parallel capacitors. We predict that in improved designs, additional board layout techniques could increase the resonant frequency by using field cancellation techniques.

Figure 5:
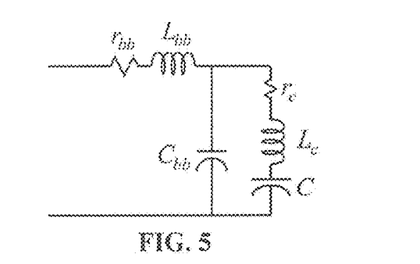
FIG. 5 is a representative circuit model used as the basis for simulations of our prototype bus.
Figure 6:
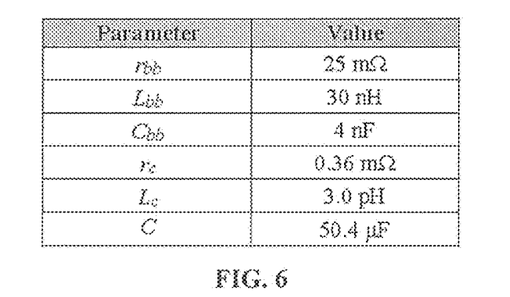
FIG. 6 is a table listing the parameter values indicated in FIG. 5 and used in the simulation of our prototype bus. The parameters listed in the table are the bus bar series resistance $r_{bb}$, the bus bar inductance $L_{bb}$, the bus bar capacitance $C_{bb}$, the DC link capacitor equivalent series resistance $r_c$, the DC link capacitor equivalent series inductance $L_c$, and the DC link capacitance C.

The input impedance of our prototype bus was measured at two terminals at the edge of the PCB for frequencies between 1 kHz and 10 MHz. These data were then used to generate a representative circuit model of the prototype. FIG. 5 shows the circuit model, and FIG. 6 lists the parameter values for the model. This model was the basis for the simulation represented by curve C of FIG. 7.

Steady State Simulation

The Prius DC-DC converter was modeled and simulated using a commercially available, high-performance SPICE (Simulation Program with Integrated Circuit Emphasis) tool to determine an expected range for current ripple and voltage transients. Various assumptions were made where detailed system information was unavailable.

Figure 8:
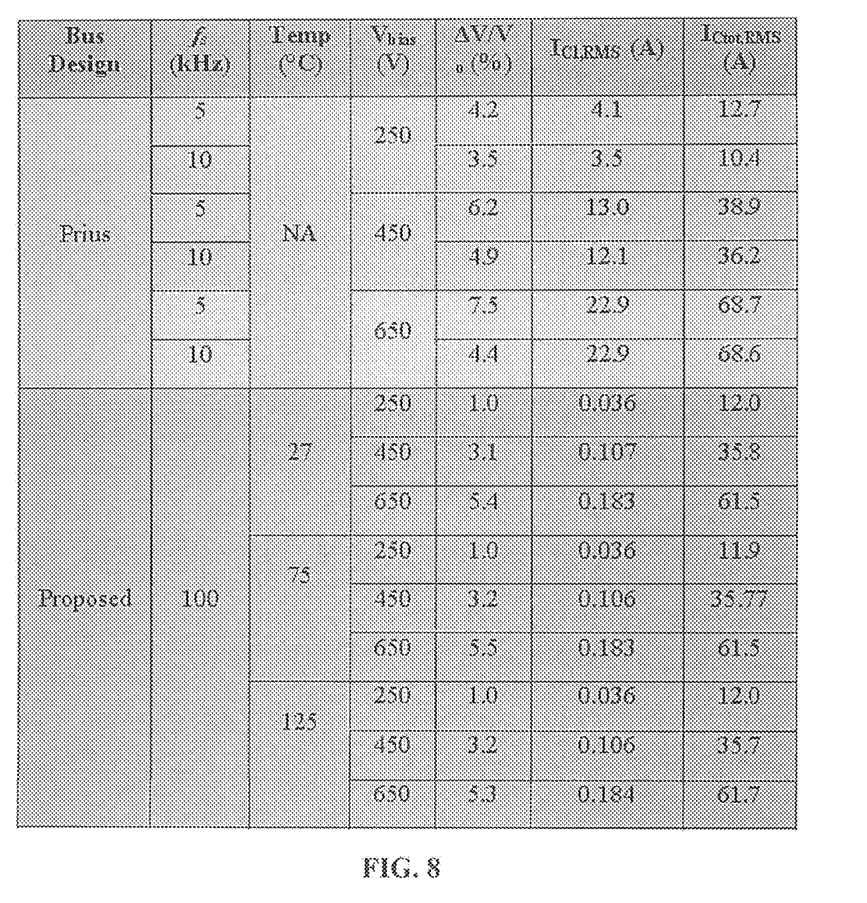
FIG. 8 is a table summarizing the results of a simulation of bus voltage ripple and capacitor current ripple in a model based on a comparative Toyota® Prius bus design operating at 5 kHz and 10 kHz and on our proposed bus operating at 100 kHz at moderate and high temperatures.

The results of the simulation are summarized in FIG. 8, wherein bus voltage ripple and capacitor current ripple are compared between the Prius bus operating at 5 kHz and 10 kHz and our proposed bus operating at 100 kHz. In the table, IC1, RMS represents the RMS current into each smoothing capacitor for the Prius bus, or into each MLCC capacitor for our proposed PCB-based bus. The symbol ICtot, RMS represents the total RMS current into either capacitor assembly. The Prius and proposed bus models were each analyzed at nominal HV bus voltages of 250 V, 450 V, and 650 V.

It should be noted that the capacitance of X7R dielectric does reduce with higher applied bias voltage and was represented for each voltage level in each model.

At a given voltage level, the variation in temperature affected the current ripple less than 4 percent between temperature extremes.

For the Prius model, a temperature-compensated model was not used for the capacitors.

In general, the ripple current in both systems was found to increase with higher voltages. This corresponds to larger duty cycles and is a standard characteristic of boost converters.

Capacitor voltage ripple, $\Delta V/V_O$, was measured as the peak-to-peak voltage at the load divided by the average voltage. A large portion of the voltage ripple is believed due to high-frequency ringing caused by the bus inductance. In the 250V case, our proposed bus performed better in voltage ripple (1% versus 3.5%), but it performed slightly worse for the 650V 75° C. case (5.5% versus 4.4%). Generally, our proposed bus at 100 kHz performed comparably in voltage and current ripple to the (estimated) Prius implementation.

The invention claimed is:

1. A DC power bus, comprising:
   an insulative base member having substantially planar upper and lower surfaces;
   at least first and second electrically conductive metal layers laminated onto or within the insulative base member;
   a bus structure that overlies the upper surface of the insulative base member; and
   a plurality of capacitors mounted in a capacitor array on at least the lower surface of the insulative base member, wherein:
   the bus structure comprises an upper metal plate, a lower metal plate, and a dielectric film interposed between the upper and lower metal plate;
   each of said capacitors is electrically connected between the first and second laminated electrically conductive metal layers such that said capacitors are connected in parallel with each other; and
   the upper and lower metal plates of the bus structure are respectively electrically connected to the first and second laminated electrically conductive metal layers.

2. The DC power bus of claim 1, wherein:
   the insulative base member is a printed circuit board;
   first and second laminated electrically conductive metal layers are copper planes of the printed circuit board; and
   the upper and lower metal plates of the bus structure are made of aluminum.

3. The DC power bus of claim 1, wherein the said capacitors are multilayer ceramic capacitors.

4. The DC power bus of claim 1, wherein the said capacitors are arranged in a regular one-dimensional array.

5. The DC power bus of claim 1, wherein the said capacitors are arranged in a regular two-dimensional array.

6. The DC power bus of claim 1, wherein upper metal plate of the bus structure is intermittently connected to the first laminated electrically conductive metal layer by vertical interconnections that pass through holes in the lower metal plate of the bus structure.

7. The DC power bus of claim 1, configured with a resonant frequency greater than 100 kHz.

8. Apparatus comprising the DC power bus of claim 1, wherein:
   the DC power bus is connected to a power inverter, or to a DC-to-DC converter, or to a power inverter and to a DC-to-DC converter, and
   the power inverter comprises one or more wide bandgap switching devices, or the DC-to-DC converter comprises one or more wide bandgap switching devices, or the power inverter and the DC-to-DC converter each comprise one or more wide bandgap switching devices.

9. The apparatus of claim 8, wherein at least one said wide bandgap switching device is a silicon carbide power transistor.

10. The apparatus of claim 8, wherein the power inverter operates at a switching frequency of at least 100 kHz, or the DC-to-DC converter operates at a switching frequency of at least 100 kHz, or the power inverter and the DC-to-DC converter each operate at a switching frequency of at least 100 kHz.

11. The apparatus of claim 8, wherein no snubbing capacitors additional to the DC power bus capacitor array are connected across any wide-bandgap switching device.

12. A method, comprising:
    delivering a flow of DC electric power from a producer to a consumer of power in an electric power system on a pair of parallel metal bus plates separated by a dielectric film; and
    removing periodic components from the flow of DC electric power by filtering;
    wherein:
    the filtering comprises shunting the periodic components through a plurality of capacitors that are mounted in a capacitor array on the lower surface of an insulative base member and connected in parallel between first and second electrically conductive metal layers laminated onto or within the insulative base member; and
    the shunting comprises conducting the periodic components through a plurality of electrical connections from each of the parallel metal bus plates to a respective one of the first and second laminated layers.

13. The method of claim 12, wherein the capacitors of the capacitor array are multilayer ceramic capacitors.

14. The method of claim 12, wherein the producer of power is a power inverter or a DC-to-DC converter, and the method further comprises operating the producer of power at a switching frequency of at least 100 kHz.

15. The method of claim 12, performed at a steady-state temperature greater than 100° C.

* * * * *